United States Patent [19]

Frensley

[11] Patent Number: 4,866,488
[45] Date of Patent: Sep. 12, 1989

[54] BALLISTIC TRANSPORT FILTER AND DEVICE

[75] Inventor: William R. Frensley, Richardson, Tex.

[73] Assignee: Texas Instruments Incorporated, Dallas, Tex.

[21] Appl. No.: 303,084

[22] Filed: Jan. 27, 1989

Related U.S. Application Data

[63] Continuation of Ser. No. 717,414, Mar. 29, 1985, abandoned.

[51] Int. Cl.$^4$ .................... H01L 29/205; H01L 29/68
[52] U.S. Cl. .......................................... 357/4; 357/16; 357/22; 357/34
[58] Field of Search ...................... 357/4, 16, 34, 22 A

[56] References Cited

U.S. PATENT DOCUMENTS

| | | | |
|---|---|---|---|
| 3,626,328 | 12/1971 | Esaki et al. | 357/16 |
| 4,205,329 | 5/1980 | Dingle | 357/4 SL |
| 4,482,910 | 11/1984 | Nishizawa | 357/16 |

FOREIGN PATENT DOCUMENTS

| | | | |
|---|---|---|---|
| 106724 | 4/1984 | European Pat. Off. | 357/16 |
| 2801292 | 10/1978 | Fed. Rep. of Germany | 357/16 |

*Primary Examiner*—William D. Larkins
*Attorney, Agent, or Firm*—Carlton H. Hoel; James T. Comfort; Melvin Sharp

[57] ABSTRACT

An energy filter for carriers in semiconductor devices and devices with such filters are disclosed. The filter is a superlattice and the filtering action arises from the subbands and gaps in the conduction and valence bands of the superlattice. A heterojunction bipolar transistor with the filter between the emitter and base has carriers injected from the emitter into the base with energies confined to levels that minimize transit time across the base; a MESFET with a filter between a heterojunction source to channel has carriers injected with energies confined to minimize transit time across the channel. A diode with a filter in front of a drift region limits the spread of energies of injected carriers.

4 Claims, 3 Drawing Sheets

BALLISTIC TRANSPORT FILTER AND DEVICE

This application is a Continuation, of application Ser. No. 717,414, filed Mar. 29, 1985 now abandoned.

BACKGROUND OF THE INVENTION

The present invention relates to semiconductor electronic devices, and, more particularly, to devices with ballistic carrier transport.

Ballistic transport of electrons in short-channel field effect transistors and through the base of a heterojunction bipolar transistor is a much-discussed phenomenom that becomes increasingly important as the dimensions of transistors are shrunk well below the one micron scale. Such ballistic transport offers the possibility of higher switching speeds due to the minimal time that the carriers are in the channel or base. See, for example, M. Shur and L. Eastman, Ballistic Transport in Semiconductor at Low Temperatures for Low-power High-Speed Logic, 26 IEEE Tr.Elec.Dev. 1677 (1979). Ballistic transport affecting performance can also occur in devices such as IMPATT diodes that have a well-defined drift region.

However, the ballistic effect appears to depend upon the initial (injection) velocity of the carriers, so that the distance traveled prior to scattering is a function of injection energy. See, J. Tang and K. Hess, Investigation of Transient Electronic Transport in GaAs Following High Energy Injection, 29 IEEE Trans. Elec. Dev. 1906 (1982). But known devices inject carriers with a large spread of energies and fail to fully exploit ballistic transport due to the significant portion of carriers with suboptimal injection energies.

Thus it is a problem to provide devices in which the carriers are injected with energies in a narrow band in order to provide full ballistic transport.

SUMMARY OF THE INVENTION

The present invention provides a superlattice velocity filter for carriers to be injected from one region of a semiconductor device into a second region for transport or drift so that only carriers with energies within the filter passbands will be injected. In preferred embodiments the filter is located between the source and channel of a field effect transistor and between the emitter and base of a bipolar transistor. The filter precludes injection of substantially all carriers not having energies in a band that is selected to determining (minimize, maximize, or other) carrier transport time through the second region.

This solves the problems of providing transistors in which carriers are injected with energies in a narrow band for ballistic transport and of providing devices with adjustable carrier transit times.

DESCRIPTION OF THE PREFERRED EMBODIMENTS

Figure 1:
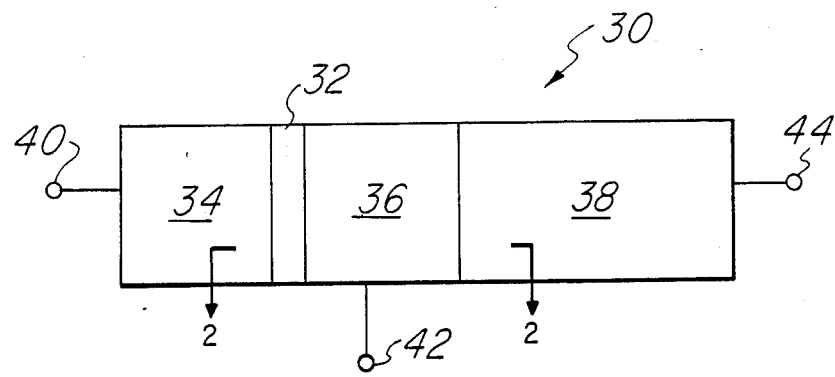
FIG.1 is a schematic view of a first preferred embodiment bipolar transistor with an electron velocity filter.
Figure 2:
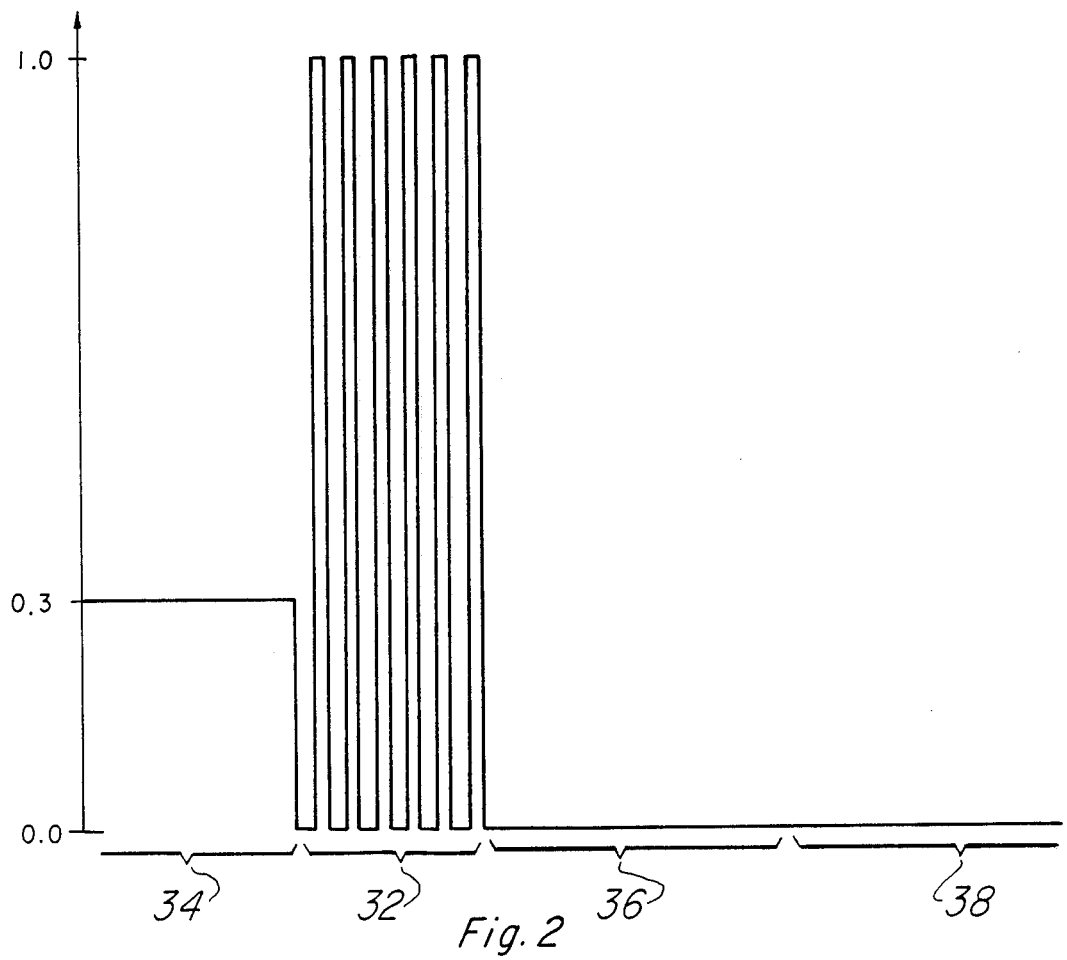
FIG.2 is a composition profile along line 2—2 of FIG.1.

FIG. 1 is a schematic cross sectional elevation view of a first preferred embodiment heterojunction bipolar transistor, generally denoted 30, incorporating a first preferred embodiment electron velocity filter 32. Transistor 30 includes n type Al.3Ga.7As emitter region 34, filter 32, p type GaAs base region 36, n type GaAs collector region 38, and contacts 40, 42, and 44 for emitter 34, base 36, and collector 38, respectively. Filter 32 is a superlattice formed of alternating layers of GaAs and Alas. For base region 36 having an undepleted width of 1,500 A during operation, the minimal transport time energy for injected electrons in the (100) direction with an applied electric field of 10 kV/cm (0.1 V/1,000 A) has been calculated to be about 0.24 eV by the reference cited in the Background, and, further, that approximately the same energy yields minimal transport time for weaker applied electric fields. Thus filter 32 is formed with its lowest miniband centered at about 0.24 eV above the conduction band edge in base region 36. Filter 32 is formed by alternating layers of AlAs 10 A thick with layers of GaAs 20 A thick for a total of ten layers. Note that to a first approximation the bottom edge of the lowest miniband is the linear interpolation of the conduction band edges of the superlattice components (AlAs and GaAs for filter 32) weighted by the fraction of each component ($\frac{1}{3}$ for AlAs and $\frac{2}{3}$ for GaAs for filter 32) and the width of the miniband is proportional to the reciprocal of the square of the superlattice period (which is 30 A for filter 32). Thus the location and width of the lowest miniband in filter 32 could be adjusted by adjusting the fraction of AlAs and the superlattice period. FIG. 2 illustrates the composition profile along line 2—2 of FIG. 1 and has reference numbers for the corresponding regions in FIG. 1.

Figure 3:
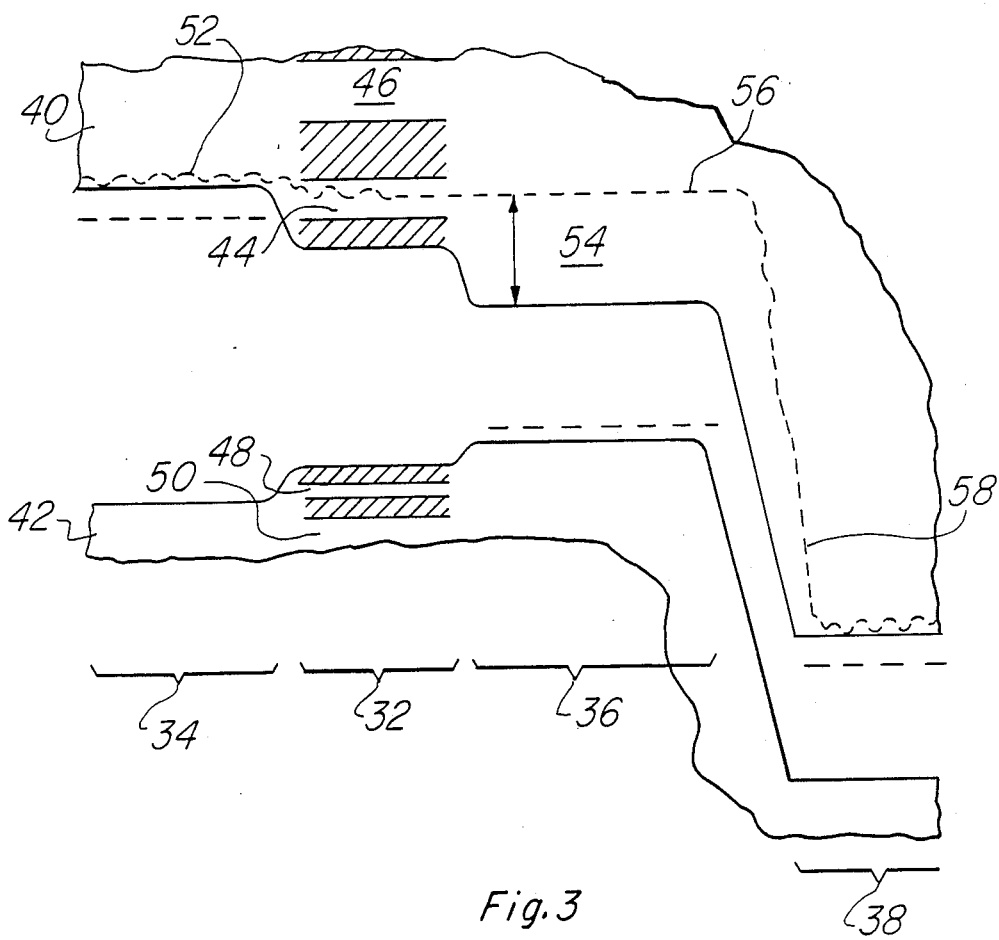
FIG.3 is an energy band diagram corresponding to the profile illustrated in FIG.2.

FIG. 3 illustrates the energy bands corresponding to the profile of FIG. 2 for transistor 30 biased in the active region. The conduction band 40 and the valence band 42 in filter 32 are split into subbands (illustrated as 44, 46, 48, and 50 in FIG. 3) due to the interference effects of the wavefunctions of electrons or holes traversing filter 32 arising from the plurality of interfaces forming filter 32. Thus if a conduction electron in emitter 34 is injected into base 36, it must first traverse filter 32 and, consequently, will have its energy confined to one of the allowed levels of the subbands as it enters base 36. An example is schematically illustrated by dotted line 52 to represent a conduction electron passing from left to right in FIG. 3 from emitter 34 into subband 44 of filter 32. If the energy of this electron upon injection into base 36 (illustrated by vertical distance 54 in FIG. 3) is near the energy for minimal scattering, then the electron will pass through base 36 with minimal change of energy (this is illustrated by the horizontal dotted line 56). Once the electron is swept into collector 38, it quickly relaxes to the conduction band edge as illustrated by dotted line 58 in FIG. 3. The minimal scattering ballistic traversal of base 36 by the filtered conduction electrons injected from emitter 34 implies that the transit time of the injected electrons through base 36 is minimized.

Figure 4:
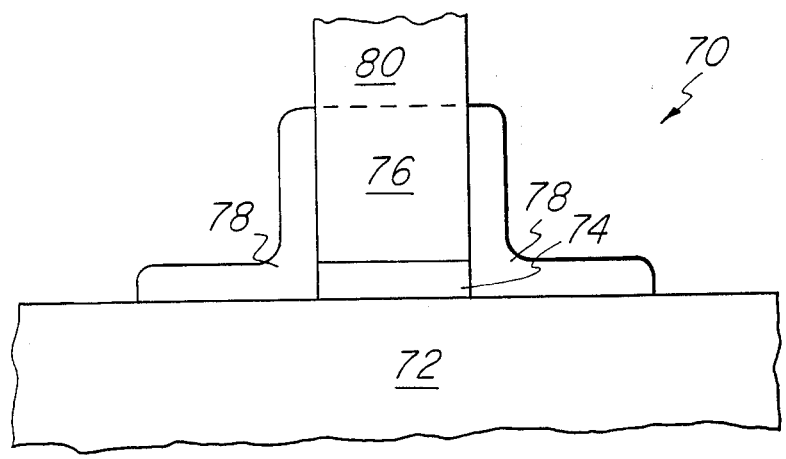
FIG.4 is a schematic cross sectional view of a second preferred embodiment field effect transistor with an electron velocity filter.
Figure 5A:
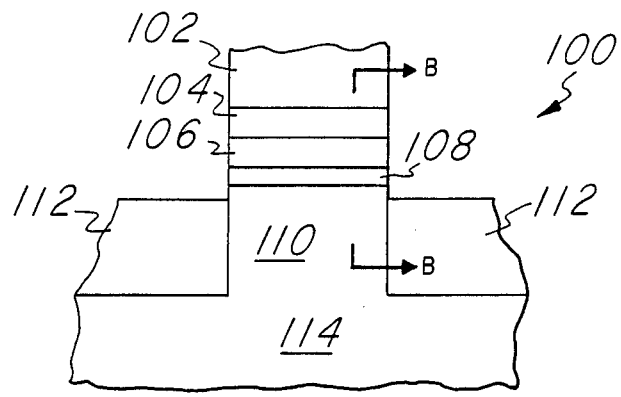
FIGS.5A-B are schematic cross sectional elevation and composition profile diagrams of a third preferred embodiment field effect transistor with an electron velocity filter.

FIG. 4 shows a cross sectional elevation view of vertical field effect transistor (MESFET) 70 which includes n GaAs source region 72, superlattice filter 74, n GaAs channel region 76, titanium gate 78, n GaAs drain region 80, and source and drain contacts 82 and 84, respectively. Channel region 76 is 0.5 micron deep (horizontal in FIG. 4) and extends in the direction perpendicular to the plane of FIG. 3 to set the channel width. Gate 78 covers filter 74 (about 200 A) plus defines the length (vertical in FIG. 4) of channel 76 at about 1,500 A. Filter 74 is similar to filter 32 of transistor 30 and includes ten alternating layers of AlAs 10 A thick (vertical in FIG. 4) and GaAs 20 A thick. Filter 74 allows only electrons with energies of about 0.24 eV to enter channel 76 and, thus, minimizes the transit time for traversing channel 76. FIG. 5A is a schematic cross sectional elevation of third preferred embodiment transistor 100. Transistor 100 is a vertical field effect transistor (MOSFET) which includes n+GaAs contact region 102, graded AlGaAs region 104, Al.3Ga.7As source region 106, velocity filter 108, n GaAs channel region 110, titanium gate 112, and drain region 114. Graded region 104 is $Al_xGa_{1-x}As$ with $x$ linearly varying from 0 at region 102 to 0.3 at region 106; note that region 104 is essentially a smooth transition from source 106 to contact region 102. Contact 102 is used because of the difficulty of making ohmic contacts directly to Al.3Ga.7As region 106 and the relative ease of making ohmic contacts to GaAs region 102.

Regions 104 and 106 and 1,000 A thick (vertical in FIG. 5A), and filter 108 is similar to filter of 32 of transistor 30 and includes ten alternating layers of AlAs 10 A thick and GaAs 20 A thick. Channel 110 is 0.5 micron deep (horizontal in FIG. 5A), 4,000 A long (vertical), and 10 microns wide (perpendicular to the plane of FIG. 5A). Filter 108 operates as filters 32 and 74 and only allows electrons with energies about 0.24 eV enter channel 110 from source 106; this minimizes transit time for the injected electrons in channel 110 as discussed previously.

Figure 5B:
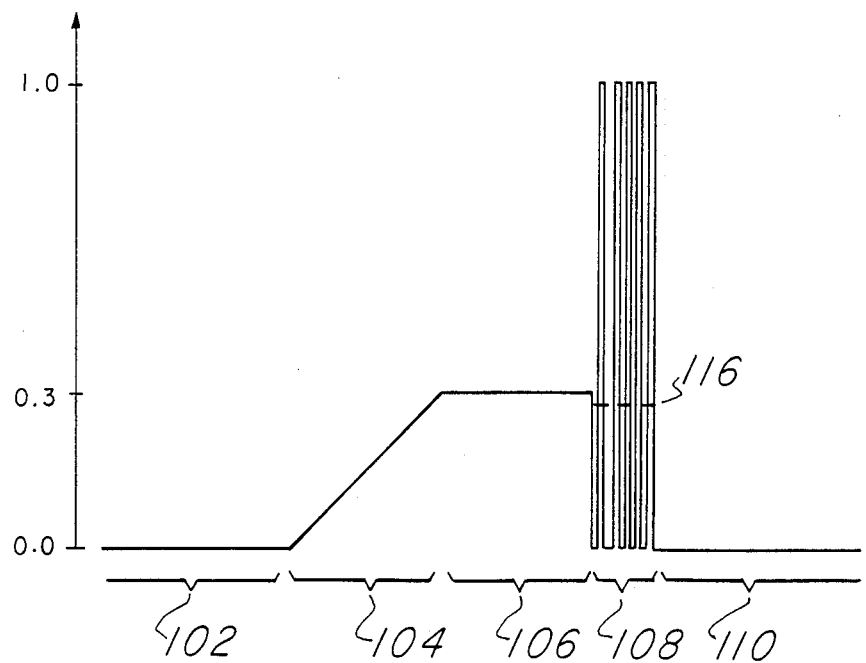

FIG. 5B is a composition profile showing the fraction of AlAs along line B—B of FIG. 5A with the passband of filter 108 heuristically indicated by dotted line 116.

MODIFICATIONS AND ADVANTAGES

Many modifications of the preferred embodiments may be made while still preserving the energy filtering of carriers entering a base, channel or drift type region. For example, the dimensions, shapes, and energy levels of the preferred embodiment devices can be varied while still retaining the device characteristics, such as the gate of the second preferred embodiment could be on just one side of the channel and a semi-insulating substrate could be on the other side of the channel. Further, devices with holes as the injected carriers and superlattices with subbands of the valence band as energy filters operate in analogous fashion.

Materials other than the AlGaAs system can be used, such as HgCdTe, InAsP, AlGaInAsP, etc., and the components of each system can be varied, such as use of Al.4Ga.6As and Al.1Ga.9As for the emitter and base of the first preferred embodiment together with a superlattice filter fabricated from alternating layers of Al.2Ga.8As and Al.9Ga.1As.

The superlattice filter can be of any number of periods, not just the five periods of the preferred embodiments, and can have more than two components in a period. Further, the superlattice filter can have pulse width modulation (the fraction of a period occupied by a component is varied through the superlattice); this permits replacement of the graded region plus source region of the third preferred embodiment partially or entirely with the superlattice. That is, the energy filtering can be built into the source structure, including a ramp up of the conduction band edge.

Devices with drift or transit regions for carriers are numerous; and if drift or transit characteristics depend upon carrier injection energy, then an energy filter superlattice can be used to control device characteristics. Further, in various IMPATT diodes, carriers drift over a portion of the diode at their scattering limited velocity, and thus the insertion of one or more superlattice velocity filters in a drift region allows for some control on the drift velocity and, consequently,. Some control of the scattering and avalanche multiplication of the carriers.

I claim:
1. A transistor, comprising:
   (a) a first region of semiconductor material;
   (b) a second region of semiconductor material;
   (c) a superlattice between and butting said first and second regions, so that carriers injected from said first region into said second region penetrate the layers of said superlattice with energies consistent with the minibands of said superlattice; and
   (d) a third region of semiconductor material located to collect carriers passing through said second region.
2. The transistor of claim 1, wherein:
   (a) said first region is an emitter;
   (b) said second region is a base; and
   (c) said third region is a collector.
3. The transistor of claim 2, wherein:
   (a) said emitter is made of $Al_xGa_{1-x}As$;
   (b) said base is made of $Al_yGa_{1-y}As$;
   (c) said collector is made of $Al_zGa_{1-z}As$; and
   (d) said superlattice has components of GaAs and AlaAs.
4. The transistor of claim 1, further comprising:
   (a) a gate; and wherein:
   (b) said first region is a source;
   (c) said second region is a channel region; and
   (d) said third region is a drain.

* * * * *